(12) United States Patent
Britt et al.

(10) Patent No.: US 7,968,353 B2
(45) Date of Patent: Jun. 28, 2011

(54) APPARATUS AND METHODS FOR MANUFACTURING THIN-FILM SOLAR CELLS

(75) Inventors: Jeffrey S. Britt, Tucson, AZ (US); Scott Wiedeman, Tucson, AZ (US)

(73) Assignee: Global Solar Energy, Inc., Tucson, AZ (US)

( * ) Notice: Subject to any disclaimer, the term of this patent is extended or adjusted under 35 U.S.C. 154(b) by 0 days.

(21) Appl. No.: 12/424,512

(22) Filed: Apr. 15, 2009

(65) Prior Publication Data

US 2009/0258444 A1  Oct. 15, 2009

Related U.S. Application Data

(60) Provisional application No. 61/124,467, filed on Apr. 15, 2008, provisional application No. 61/124,468, filed on Apr. 15, 2008.

(51) Int. Cl.
*H01L 21/00* (2006.01)
*H01L 21/66* (2006.01)

(52) U.S. Cl. .......... 438/5; 438/14; 438/95; 257/E21.528
(58) Field of Classification Search ............ 438/95, 438/5, 14; 257/E21.528
See application file for complete search history.

(56) References Cited

U.S. PATENT DOCUMENTS 6,372,538 B1 * 4/2002 Wendt et al. .............. 438/95
2008/0093221 A1 * 4/2008 Basol ........................ 205/170

FOREIGN PATENT DOCUMENTS

WO    WO2005086238 A1 * 9/2005
* cited by examiner

*Primary Examiner* — Angel Roman
(74) *Attorney, Agent, or Firm* — Kolisch Hartwell, P.C.

(57) ABSTRACT

Improved methods and apparatus for forming thin-film layers of semiconductor material absorber layers on a substrate web. According to the present teachings, a semiconductor layer may be formed in a multi-zone process whereby various layers are deposited sequentially onto a moving substrate web.

17 Claims, 7 Drawing Sheets

APPARATUS AND METHODS FOR MANUFACTURING THIN-FILM SOLAR CELLS

CROSS-REFERENCE TO RELATED APPLICATION(S)

This application claims priority under 35 U.S.C. §119 and applicable foreign and international law of U.S. Provisional Patent Application Ser. Nos. 61/124,467 filed Apr. 15, 2008 and 61/124,468 filed Apr. 15, 2008, which are hereby incorporated by reference in their entireties.

This application also incorporates in their entirety the following patents and patent applications: U.S. Pat. Nos. 6,310,281, 6,372,538, 7,194,197, Ser. Nos. 11/727,975, 12/154,548, 12/154,549, and 12/154,550.

BACKGROUND

The field of photovoltaics generally relates to multi-layer materials that convert sunlight directly into DC electrical power. The basic mechanism for this conversion is the photovoltaic effect, first observed by Antoine-Cesar Becquerel in 1839, and first correctly described by Einstein in a seminal 1905 scientific paper for which he was awarded a Nobel Prize for physics. In the United States, photovoltaic (PV) devices are popularly known as solar cells or PV cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the metallurgical junction that forms the electronic p-n junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from junction, with the electron moving toward the electrode on the n-type side, and the hole moving toward the electrode on the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage. The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin-film" PV cell. In comparison to other types of PV cells, such as crystalline silicon PV cells, thin-film PV cells require less light-absorbing semiconductor material to create a working cell, and thus can reduce processing costs. Thin-film based PV cells also offer reduced cost by employing previously developed deposition techniques for the electrode layers, where similar materials are widely used in the thin-film industries for protective, decorative, and functional coatings. Common examples of low cost commercial thin-film products include water impermeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin-film deposition techniques.

Furthermore, thin-film cells have exhibited efficiencies approaching 20%, which rivals or exceeds the efficiencies of the most efficient crystalline cells. In particular, the semiconductor material copper indium gallium diselenide (CIGS) is stable, has low toxicity, and is truly a thin film, requiring a thickness of less than two microns in a working PV cell. As a result, to date CIGS appears to have demonstrated the greatest potential for high performance, low cost thin-film PV products, and thus for penetrating bulk power generation markets. Other semiconductor variants for thin-film PV technology include copper indium diselenide, copper indium disulfide, copper indium aluminum diselenide, and cadmium telluride.

Some thin-film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, when comparing technology options applicable during the deposition process, rigid substrates suffer from various shortcomings during processing, such as a need for substantial floor space for processing equipment and material storage, expensive and specialized equipment for heating glass uniformly to elevated temperatures at or near the glass annealing temperature, a high potential for substrate fracture with resultant yield loss, and higher heat capacity with resultant higher electricity cost for heating the glass. Furthermore, rigid substrates require increased shipping costs due to the weight and fragile nature of the glass. As a result, the use of glass substrates for the deposition of thin films may not be the best choice for low-cost, large-volume, high-yield, commercial manufacturing of multi-layer functional thin-film materials such as photovoltaics. Therefore, a need exists for improved methods and apparatus for depositing thin-film layers onto a non-rigid, continuous substrate.

DETAILED DESCRIPTION

I. Introduction

Manufacture of flexible thin-film PV cells may proceed by a roll-to-roll process. As compared to rigid substrates, roll-to-roll processing of thin flexible substrates allows for the use of relatively compact, less expensive vacuum systems, and of some non-specialized equipment that already has been developed for other thin-film industries. Flexible substrate materials inherently have lower heat capacity than glass, so that the amount of energy required to elevate the temperature is minimized. They also exhibit a relatively high tolerance to rapid heating and cooling and to large thermal gradients, resulting in a low likelihood of fracture or failure during processing. Additionally, once active PV materials are deposited onto flexible substrate materials, the resulting unlaminated cells or strings of cells may be shipped to another facility for lamination and/or assembly into flexible or rigid solar modules. This strategic option both reduces the cost of shipping (lightweight flexible substrates vs. glass), and enables the creation of partner-businesses for finishing and marketing PV modules throughout the world. Additional details relating to the composition and manufacture of thin-film PV cells of a type suitable for use with the presently disclosed methods and apparatus may be found, for example, in U.S. Pat. Nos. 6,310,281, 6,372,538, and 7,194,197, all to Wendt et al., and in Provisional Patent Application Ser. No. 61/063,257, filed Jan. 31, 2008. These references are hereby incorporated into the present disclosure by reference for all purposes.

Figure 1:
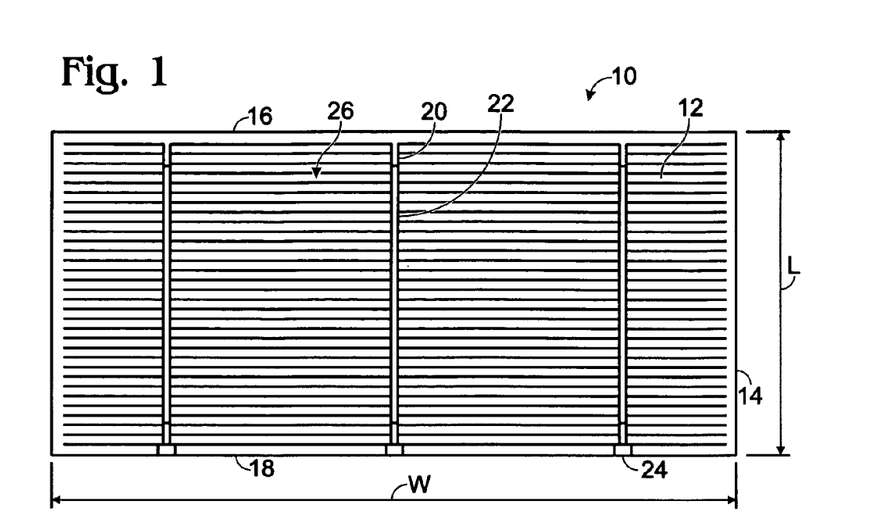
FIG. 1 is a top view of a thin-film photovoltaic cell, according to aspects of the present disclosure.

FIG. 1 shows a top view of a thin-film photovoltaic cell 10, in accordance with aspects of the present disclosure. Cell 10 is substantially planar, and typically rectangular as depicted in FIG. 1, although shapes other than rectangular may be more suitable for specific applications, such as for an odd-shaped rooftop or other surface. The cell has a top surface 12, a bottom surface 14 opposite the top surface, and dimensions including a length L, a width W, and a thickness. The length and width may be chosen for convenient application of the cells and/or for convenience during processing, and typically are in the range of a few centimeters (cm) to tens of cm. For example, the length may be approximately 100 millimeters (mm), and the width may be approximately 210 mm, although any other suitable dimensions may be chosen. The edges spanning the width of the cell may be characterized respectively as a leading edge 16 and a trailing edge 18. The total thickness of cell 10 depends on the particular layers chosen for the cell, and is typically dominated by the thickness of the underlying substrate of the cell. For example, a stainless steel substrate may have thickness on the order of 0.025 mm (25 microns), whereas all of the other layers of the cell may have a combined thickness on the order of 0.002 mm (2 microns) or less.

Cell 10 is created by starting with a flexible substrate, and then sequentially depositing multiple thin layers of different materials onto the substrate. This assembly may be accomplished through a roll-to-roll process whereby the substrate travels from a pay-out roll to a take-up roll, traveling through a series of deposition regions between the two rolls. The PV material then may be cut to cells of any desired size. The substrate material in a roll-to-roll process is generally thin, flexible, and can tolerate a relatively high-temperature environment. Suitable materials include, for example, a high temperature polymer such as polyimide, or a thin metal such as stainless steel or titanium, among others. Sequential layers typically are deposited onto the substrate in individual processing chambers by various processes such as sputtering, evaporation, vacuum deposition, chemical deposition, and/or printing. These layers may include a molybdenum (Mo) or chromium/molybdenum (Cr/Mo) back contact layer; an absorber layer of material such as copper indium diselenide, copper indium disulfide, copper indium aluminum diselenide, or copper indium gallium diselenide (CIGS); a buffer layer or layers such as a layer of cadmium sulfide (CdS); and a transparent conducting oxide (TCO) layer acting as the top electrode of the PV cell. In addition, a conductive current collection grid, usually constructed primarily from silver (Ag) or some other conductive metal, is typically applied over the TCO layer.

Although the precise thickness of each layer of a thin-film PV cell depends on the exact choice of materials and on the particular application process chosen for forming each layer, exemplary materials, thicknesses and methods of application of each layer described above are as follows, proceeding in typical order of application of each layer onto the substrate:

| Layer Description | Exemplary Material | Exemplary Thickness | Exemplary Method of Application |
| --- | --- | --- | --- |
| Substrate | Stainless steel | 25 μm | N/A (stock material) |
| Back contact | Mo | 320 nm | Sputtering |
| Absorber | CIGS | 1700 nm | Evaporation |
| Buffer | CdS | 80 nm | Chemical deposition |
| Front electrode | TCO | 250 nm | Sputtering |
| Collection grid | Ag | 40 μm | Printing |

The remainder of this disclosure focuses on various methods and apparatus for forming a semiconductor absorber layer on an underlying substrate web.

II. Absorber Layer

This section describes various general considerations regarding formation of a thin-film absorber layer on a substrate web. The absorber layer typically is p-type semiconductor in the form of copper-indium-gallium-diselenide (CIGS) or its readily acceptable counterpart, copper-indium-diselenide (CIS). Other materials, such as copper indium disulfide or copper indium aluminum diselenide, also may be used. These different compositions, among others, can be used essentially interchangeably as an absorber layer in various embodiments of the present teachings, depending on the particular properties desired in the final product. For convenience and specificity, the remainder of this disclosure occasionally may refer to the absorber layer as a CIGS layer. However, it should be understood that some or all of the present teachings also may be applied to various other suitable absorber layer compositions.

Figure 2:
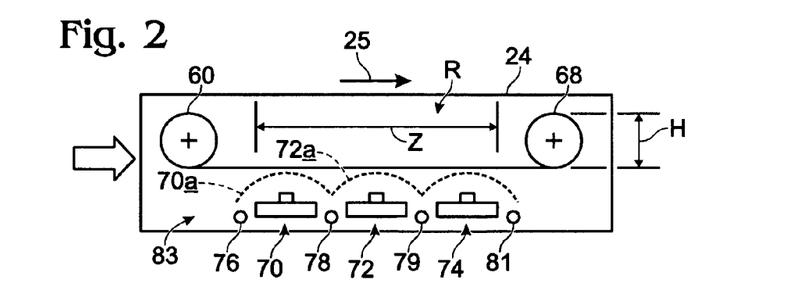
FIG. 2 is a schematic side elevational view showing formation of a p-type semiconductor layer within a deposition chamber.

FIG. 2 illustrates schematically a configuration for the inside of an absorber layer deposition chamber 24 according to one embodiment of the present teachings. As shown schematically in FIG. 2, the absorber layer is applied within the deposition chamber, and specifically within a deposition region R of the chamber, in a multi-step process. The deposition region, and typically the entire deposition chamber, are evacuated to near vacuum, typically to a pressure of approximately 700-2000 microtorr (μTorr). This background pressure typically is primarily supplied by selenium gas emitted into the deposition region by a selenium delivery system, resulting in deposition of selenium onto the web. The deposition of additional materials such as gallium, indium and copper generally may be described as a roll-to-roll, molten-liquid-to-vapor co-evaporation process.

The strip material, or substrate web, feeds in the direction of arrow 25 from a pay-out roll 60 to a downstream take-up roll 68 within chamber 24. As the strip material moves through chamber 24, the p-type absorber layer is formed on the bottom surface of the substrate web (as depicted in FIG. 2). A transport-guide structure (not shown) is employed between rolls 60, 68 in chamber 24 to support and guide the strip. The short, open arrow which appears at the left side of the block representation of chamber 24 in FIG. 2 symbolizes the hardware provided for the delivery of appropriate constituent substances to the interior of chamber 24.

Within chamber 24, and specifically within deposition region R, a molten-liquid-to-vapor co-evaporation process for establishing a p-type semiconductor layer is performed. Chamber 24 is designed specifically for the creation of a CIGS layer, as opposed, for example, to a CIS layer. Accordingly, structures 70, 72, 74, 76, 78, 79 and 81 function to generate vapors of copper (70), gallium (72), indium (74) and selenium (76, 78, 79, 81) for deposition onto the moving substrate web. Structures 70-81 form the bulk of the vapor-deposition-creating system, generally indicated at 83, of the present embodiment. The vapor deposition environment created in deposition region R may provide a continuum of evaporant fluxes. Within region R, effusion fluxes may be held approximately constant, and by translating the substrate web over the sources, the substrate may encounter a varying flux of material specifically designed to achieve optimum performance in the CIGS layer.

Blocks 70, 72 and 74, which relate to the vapor-delivery of copper, gallium and indium, respectively, represent heated effusion sources for generating plumes of vapor derived from these three materials. Each of these effusion sources may include: (1) an outer thermal control shield; (2) a boat, reservoir, or crucible containing the associated molten copper, gallium, or indium; (3) a lid that covers the associated case and reservoir, and that contains one or more vapor-ejection nozzles (or effusion ports) per crucible to assist in creating vapor plumes; and (4) a specially designed and placed heater located near the effusion ports, or in some embodiments formed integrally with the ports.

Structures 76, 78, 79 and 81 represent portions of a selenium delivery system that creates a background selenium gas pressure in some or all parts of the deposition region. A selenium delivery system may deliver selenium directly through one or more orifices in a local Se source. Alternatively, in the embodiment of FIG. 2, circles 76, 78, 79, 81 represent end views of plural, laterally spaced, generally parallel elongate sparger tubes (or fingers) that form part of a manifold that supplies, to the deposition environment within chamber 24, a relatively evenly volumetrically dispersed selenium vapor. Each tube has one or more linearly spaced outlet orifices, each orifice having a diameter of approximately one millimeter (1.0 mm). The delivered selenium vapor may be derived from a single pool, site, or reservoir of selenium, which typically vaporizes within the reservoir through sublimation. The selenium delivery system may be configured to provide any suitable selenium pressure within the deposition region, which in most embodiments will fall within the range of 0.7-2.0 millitorr.

The processing rate using a roll-to-roll deposition approach is limited only by the web translation rate through the deposition region, and by the web width. The web translation rate is set by the minimum time required for sufficient film deposition, which is determined by the details of the reactions that occur inside the deposition region. The maximum web width is limited by the requirement of sufficiently uniform composition and thickness across the width and, as a practical matter, also may be limited by the availability of sufficiently wide rolls of suitable substrate material, such as 25 μm-thick stainless steel. Some vacuum coating techniques, including evaporative techniques used for CIGS deposition and described in the present disclosure, rely on evaporation sources that use arrays of orifices, or effusion ports, arranged to provide sufficiently uniform deposition. Deposition uniformity across the width of the web (concurrent with sufficient material deposition) can be achieved if the effusion ports are spaced across the web width, and if the mass flow of each effusion port is well-controlled.

The mass flow rate from an evaporation source typically is a sensitive function of temperature inside the effusion source near the effusion port. Therefore, for a given geometry and configuration of effusion ports, the flow rate generally is controlled through careful control of the temperature at each port and/or effusion source. The dependence of flow rate on temperature and other factors can be understood from the well-developed theory of low-pressure gas flow through an orifice, and generally can be predicted to within 5 or 10% based on the theory. Specifically, within a vacuum there are three regimes in which low pressure gas flow occurs: (1) the free molecular regime, (2) the transitional flow regime and (3) the laminar or full viscous regime. In qualitative terms, the free molecular regime describes gas flow in which gas phase collisions are rare enough that only molecule-wall collisions are significant. Transitional flow describes a situation where molecule-molecule collisions occur frequently enough to affect the flow behavior, but do not occur frequently enough to be described accurately by the full viscous flow model that would be used at or near atmospheric pressure.

The determination of the applicable flow regime is achieved by calculating the Knudsen number:

$$kn = \frac{\lambda}{\Gamma} \qquad \text{(eqn. 1)}$$

where λ is the mean free path and F is the orifice radius. If Kn>1, the system is in the free molecular regime and the mass flow rate is described by the following equation:

$$F_{eff} = \pi\Gamma^2 K\left(\frac{M}{2\pi RT}\right)^{\frac{1}{2}}(p_1 - p_2) \quad \text{(eqn. 2)}$$

where F is the mass flow rate through the orifice, M is the molecular weight of the gas molecules, R is the ideal gas constant, T is the temperature, and $p_1$ and $p_2$ are the pressures on either side of the orifice. K is an empirically determined constant which is a function of the aspect ratio (L/Γ, where L is the orifice length) of the orifice. For L/Γ less than 1.5, K is given by $$K = \frac{1}{1 + 0.5\frac{L}{\Gamma}} \quad \text{(eqn. 3)}$$

For L/Γ>1.5, $$K = \frac{1 + 0.4\left(\frac{L}{\Gamma}\right)}{1 + 0.95\left(\frac{L}{\Gamma}\right) + 0.15\left(\frac{L}{\Gamma}\right)^2} \quad \text{(eqn. 4)}$$

In the case of 0.01<Kn<1, there are two equations which must be solved for both F and p':

$$F_{eff} = \pi\Gamma^2 C\left(\frac{M}{2\pi RT}\right)^{\frac{1}{2}}(p_1 - p') \quad \text{(eqn. 5)}$$

$$F_{eff} = \frac{\pi\Gamma^4}{16\,\mu L}(p'^2 - p_2^2)\left(1 + 4\left(\frac{2}{f_d} - 1\right)\frac{\lambda}{\Gamma}\right)\left(\frac{M}{RT}\right) \quad \text{(eqn. 6)}$$

where μ is the viscosity, $f_d$ is the fraction of molecules diffusely reflected from the walls (0.85<f<1), and C is a constant (C=20).

After determining the mass flow rate, $F_{eff}$, through the orifice it becomes necessary to describe the flux intensity profile of the effusing beam, that is, to determine f=f(r,θ), where f is the flux, r is the distance from the effusion orifice, and θ is the azimuthal angle. An equation describing the flux as a function of θ and the rate of effusion is obtained by setting the rate of effusion equal to the integral of the flux over a hemispherical area. Assuming that the flux can be approximated by f=a cos$^n$θ, $$F_{eff} = \int_0^{\frac{\pi}{2}} \int_0^{2\pi} a\cos^n\theta(r^2\sin\theta)\partial\xi\partial\theta \quad \text{(eqn. 7)}$$

After solving for a in eqn. 7, $$f = \frac{F_{eff}(n+1)}{2\pi r^2}\cos^n\theta \quad \text{(eqn. 8)}$$

Although the a priori prediction of a value for n is not completely well defined, a safe approximation for both transitional flow regimes and free molecular regimes of L/D=1 is n=2. Alternatively, the exponent in the flux distribution function (n) may equal 3 or more.

Effusion rate from a given nozzle is a function of vapor pressure within the inside of the associated crucible, and this pressure is a function of the temperature of the molten material inside the reservoir in that crucible. Thus, for a particular selected nozzle size, the effusion rate to be expected is essentially a function of the temperature within the crucible. Predicting the rates of effusion of the copper, gallium, and indium sources is a straightforward solution of the equations above. The temperature-vapor pressure data of the three elements are easily found in literature and can be approximated by:

$$\text{Cu: log } P_{Cu}^{sat} = -19.818 + 2.0643 \times 10^{-2} \times T - 5.2119 \times 10^{-6} \times T^2 \quad \text{(eqn. 9)}$$

$$\text{Ga: log } P_{Ga}^{sat} = -17.2982 + 2.0829 \times 10^{-2} \times T - 6.0 \times 10^{-6} \times T^2 \quad \text{(eqn. 10)}$$

$$\text{In: log } P_{In}^{sat} = -16.238 + 2.1427 \times 10^{-2} \times T - 6.7885 \times 10^{-6} \times T^2 \quad \text{(eqn. 11)}$$

where pressure is in torr and temperature is in °C.

Application of the above principals reveals that the vapor flux incident at the deposition surface presented in a deposition chamber such as chamber 24 is, essentially, a function of the temperature within a selected crucible (and more specifically at each effusion port), the distance between the effusion ports and the intended deposition surface, and the angle between a point on the substrate and each respective effusion port. Accordingly, for a given configuration of ports and a substrate web traveling through the deposition region at a constant speed, the amount of metal vapor (collectively) incident at the deposition surface of the traveling substrate material is essentially a function of the temperature of the molten materials within the crucibles. Thus, by carefully controlling the temperatures of the molten materials at each effusion port, and by maintaining a substantially constant transport speed of the substrate material through the deposition region, the rate at which metal vapor from each crucible is applied to the appropriate deposition surface of the traveling substrate can be controlled readily to produce uniform thin-layer deposition thickness along the length of such material.

Variations in the thermal properties of insulation or heating elements, and even convective currents in the "melt" of the evaporating material, may cause temperatures near the effusion ports to differ, and thus affect the flow rate. Furthermore, the temperature inside an effusion source near each effusion port becomes increasingly difficult to control as the source increases in length, and the physical separation between the most distant effusion ports becomes large compared to the other dimensions of the source. However, wider webs typically require longer sources to coat the entire web width, posing a flow rate control problem. As described in more detail in Section III below, the present teachings seek to minimize these difficulties by using multiple, shorter sources, and by allowing for flow rate adjustment of each source independently to maintain a desired overall effusion rate.

III. Multi-Zone Deposition

Figure 3:
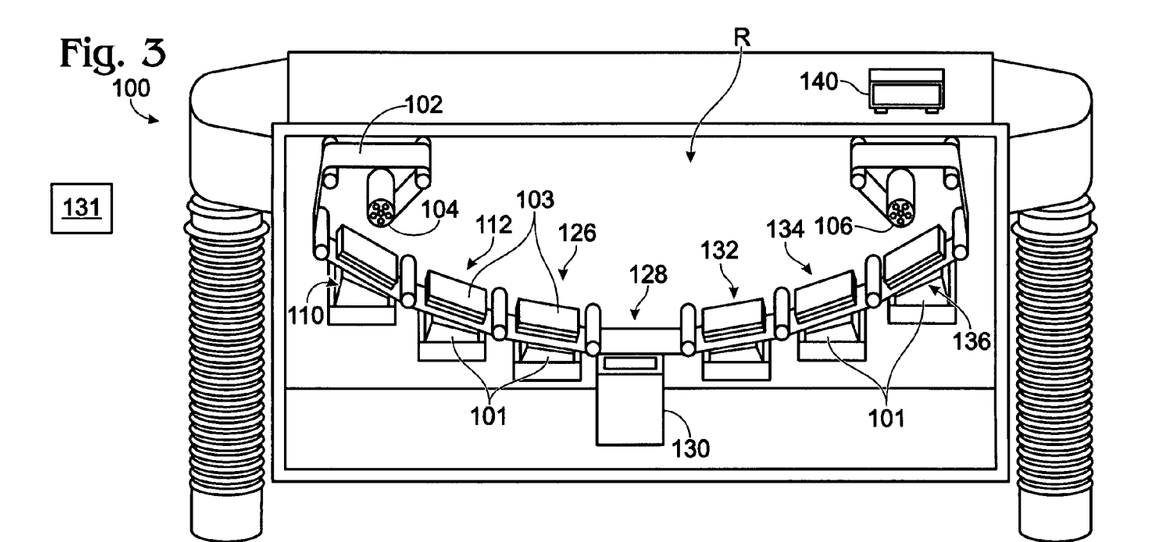
FIG. 3 is a schematic side elevational view showing interior portions of an apparatus for forming a p-type semiconductor layer in a multi-zone process.

This section relates to systems and methods for depositing a thin-film p-type semiconductor layer onto a substrate in a specific exemplary multi-zone deposition process. As described previously and depicted schematically in FIG. 2, a semiconductor layer generally may be deposited sequentially, by applying various components of the layer separately and/or in overlapping combinations. FIG. 3 is a more detailed schematic side elevational view of an apparatus for performing such a sequential deposition process. As FIG. 3 depicts, the deposition may be accomplished in a seven-zone procedure, wherein six of the seven zones are used to deposit portions of the semiconductor layer, and a seventh intermediate zone is used to monitor one or more properties of the previously deposited layers. The seven-zone procedure depicted in FIG. 3 and described herein is exemplary, and it should be appreciated that an effective p-type semiconductor layer may be deposited in a similar procedure having greater or fewer than seven zones.

In the exemplary procedure of FIG. 3, as in the more general procedure depicted in FIG. 2, deposition of the semiconductor layer occurs inside a deposition region R of an absorber layer deposition chamber 100 that has been evacuated to near vacuum, typically to a pressure of approximately 0.7-2.0 millitorr (700-2000 µTorr) that is provided by selenium gas. Also as in the general embodiment of FIG. 2, deposition in the embodiment of FIG. 3 proceeds via a roll-to-roll, molten-liquid-to-vapor co-evaporation process, wherein a substrate web 102 is transported through the deposition region from a pay-out roll 104 to a take-up roll 106, with the pay-out roll and the take-up roll both located within deposition chamber 100. Alternatively, the pay-out and take-up rolls may be disposed outside of, but in close proximity to, the deposition chamber. Substrate heaters 103 may be positioned at one or more locations of the processing path to heat substrate web 102.

Each of the six deposition zones described in this section may have a similar basic structure but may vary as to number, deposition material and location within the zone, of material sources. Each zone may include at least two material sources, for example the material sources shown in FIG. 4, each configured to emit plumes of molecules to be deposited on the moving substrate web 102, which passes above and at a distance from the sources. Two of the at least two material sources may be disposed substantially symmetrically across the transverse dimension or width of the web and may contain the same deposition material to be deposited uniformly on the moving substrate web 102.

In some zones, such as in the zone depicted in FIG. 4 and described in more detail below, two separate deposition materials may be deposited onto the web. In such cases, four sources may be provided, a first set of two sources disposed substantially symmetrically across the transverse dimension or width of the web containing a first deposition material and a second set of two sources disposed substantially symmetrically across the transverse dimension or width of the web containing a second deposition material. Each set of two sources may be configured to deposit a different material across the entire width of the web. In other zones, where only a single material is deposited onto the web, a single set of two sources may be provided and configured to deposit one material across the web.

Each deposition zone may be enclosed within a separate solid enclosure 101. Generally, each enclosure 101 may surround the associated deposition zone substantially completely, except for an aperture in the top portion of the enclosure over which the moving substrate web passes. This allows separation of the deposition zones from each other, providing the best possible control over parameters such as temperature and selenium pressure within each zone.

The exemplary chamber 100 of FIG. 3 is designed specifically for the creation of a CIGS layer by passing the substrate web through seven separate zones, including at least one or more deposition zones, within deposition region R, resulting in a CIGS layer of composite thickness between a few hundred and a few thousand nanometers. Provided bellow is a sequential description of each of the seven zones (110, 112, 126, 128, 132, 134, and 136) shown in FIG. 3.

Specifically, first zone 110 may be configured to deposit a layer of sodium fluoride (NaFl) onto the web. The presence of sodium is believed to improve p-type carrier concentration by compensating for defects in one or more of the subsequently deposited CIGS layers, and thus to improve the overall efficiency of the PV cell. An initial layer of NaFl has been found to be optimal. Alternatively, potassium (K) or lithium (Li) may serve a similar purpose as sodium. Furthermore, other compounds aside from NaFl, such as sodium selenide ($Na_2Se_2$), sodium selenite ($Na_2SeO_3$), sodium selenate ($Na_2O_4Se$), or other similar compounds incorporating potassium and/or lithium, also may be suitable for improving p-type carrier concentration.

Figure 4:
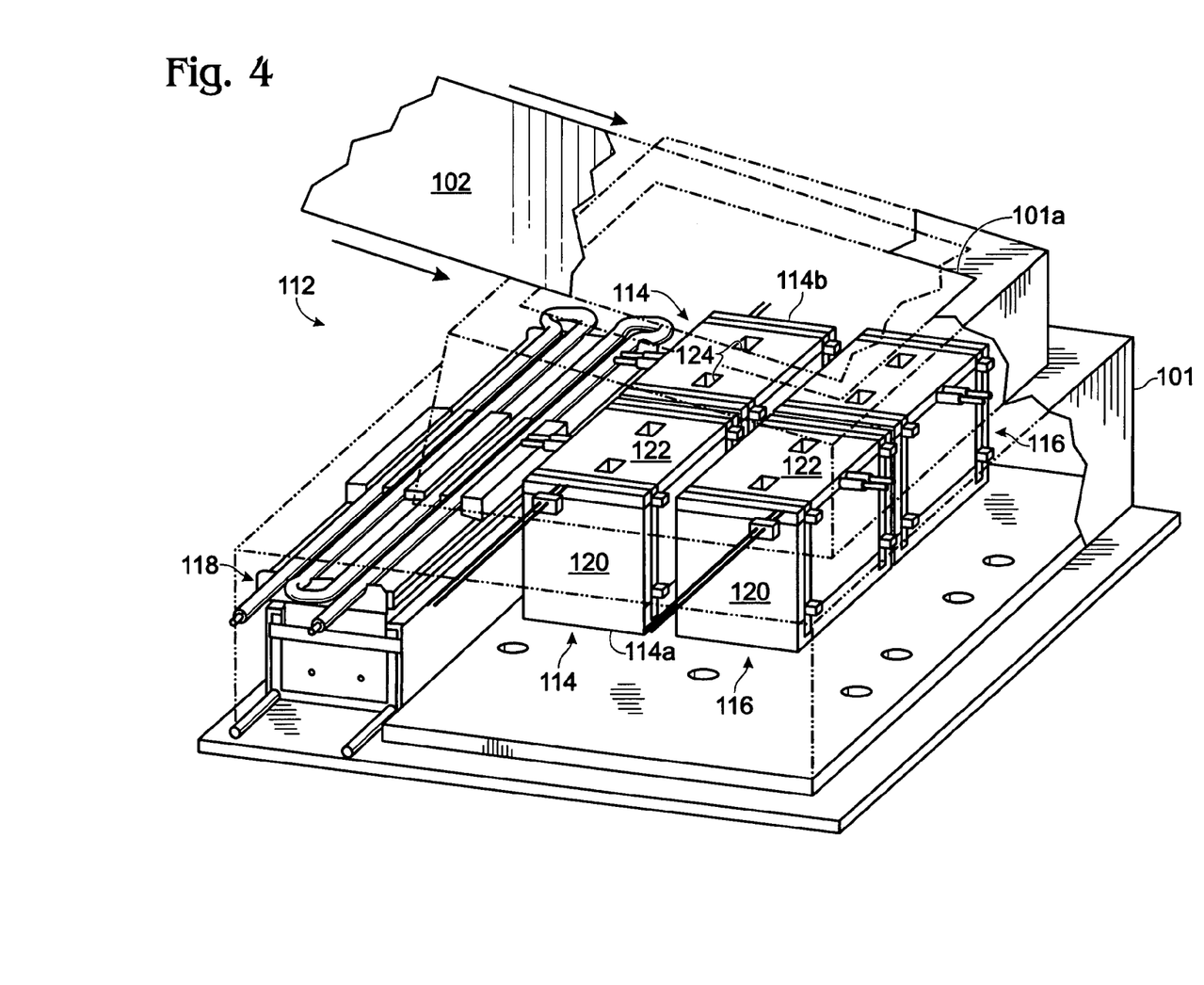
FIG. 4 is a perspective view showing one of the zones of FIG. 3 in more detail.

Second zone 112, which is shown in isolation in FIG. 4, may be configured to deposit a layer of gallium indium (GI) onto the web (or more precisely, onto the previously deposited layer of NaFl). Second zone 112 may include two gallium sources 114 disposed substantially symmetrically across the transverse dimension of the web and two indium sources 116 similarly disposed substantially symmetrically across the transverse dimension of the web. Also depicted in second zone 112 of FIG. 4 is a selenium (Se) source, generally indicated at 118. Selenium source 118 is configured to provide selenium gas to second zone 112. Providing a background of selenium gas results in deposition on the substrate web of selenium along with the GI layer.

GI (more specifically GI selenide) may be deposited through the nearly simultaneous—but separate—deposition of gallium and indium onto the same portion of the moving web. As indicated in FIG. 4, however, gallium sources 114 may be located slightly before indium sources 116 within the second zone 112, so that a small amount of gallium is deposited onto the web prior to deposition of any indium. Because gallium adheres better to the underlying web and to the previously deposited NaFl molecules, this arrangement results in better overall adhesion of the GI layer deposited in the second zone.

Selenium source 118 is configured to provide selenium gas to second zone 112, and similar selenium sources may also be located in the third, fifth, sixth and/or seventh zones within chamber 100 to provide selenium gas to the third, fifth, sixth and/or seventh zones within chamber 100, up to a pressure in the range of approximately 700-2000 µTorr. Each selenium source in a zone may be independently monitored and controlled. Providing a background of selenium gas results in deposition of selenium along with the other source materials, such as GI, such that the deposited layer may comprise indium-gallium selenide, gallium selenide or gallium-rich indium-gallium selenide.

As shown in more detail in FIG. 4, each of the two gallium sources 114 and each of the two indium sources 116 within second zone 112, and more generally each material source in any of the zones of chamber 100, may generally include a crucible or body portion 120, and a lid 122 containing one or more effusion ports 124.

Each deposition zone may itself be enclosed within a separate solid enclosure 101. Generally, each enclosure 101 may surround the associated deposition zone, for example second zone 112, substantially completely, except for an aperture 101a in the top portion of enclosure 101, over which the moving substrate web passes. This allows separation of the deposition zones from each other, providing the best possible control over parameters such as temperature and selenium pressure within each zone. Aperture 101a in the top portion of enclosure 101 may have a width that is substantially the same as the width of substrate web 102.

A deposition material is liquefied or otherwise disposed within the body portion 120 of a given source, and emitted at a controlled temperature in plumes of evaporated material through effusion ports 124. As described previously, because the angular flux of material emitted from an effusion port 124 with a particular geometry is a function primarily of temperature of the port and/or deposition material, this allows for control over the thickness and uniformity of the deposited layers created by the vapor plumes.

As shown in FIG. 3, third deposition zone 126 may be configured to deposit a layer of copper (Cu) onto the moving web. Third deposition zone 126 may include two material sources, which are structurally similar or identical in construction to the gallium and indium sources 114 and 116 described with reference to FIG. 4. Specifically, third deposition zone 126 may include two material sources, containing the deposition material copper, disposed substantially symmetrically across the transverse dimension or width W of the web. The two sources may generally include at least a body portion, and a lid containing one or more effusion ports. Third deposition zone 126 may also include a selenium source.

Sources of copper material may disposed within the third zone 126 relatively close to the entrant side of the substrate web 102 into the third zone 126, but alternatively may be disposed more toward the egress side of the third zone 126 with similar effect. However, by providing the copper sources relatively close to the entrant side of the third zone 126, the copper atoms have slightly more time to diffuse through the underlying layers prior to deposition of subsequent layers, and this may lead to preferable electronic properties of the final CIGS layer.

Fourth zone 128 may be configured as a sensing zone, in which one or more sensors, generally indicated at 130, monitor the thickness, uniformity, or other properties of some or all of the previously deposited material layers. Typically, such sensors may be used to monitor and control the effective thickness of the previously deposited copper, indium and gallium on the web, by adjusting the temperature of the appropriate deposition sources in the downstream zones and/or the upstream zones in response to variations in detected thickness. To monitor properties of the web across its entire width, two or more sensors may be used, corresponding to the two or more sources of each applied material that span the width of the web disposed substantially symmetrically across the transverse dimension of the web. Fourth zone 128 is described in more detail below with reference to FIG. 6.

Fifth zone 132 may be configured to deposit a second layer of copper, which may have somewhat lesser thickness than the copper layer deposited in third zone 126, from a pair of sources disposed substantially symmetrically across the transverse dimension of the web. Similar to the copper sources described in third zone 126, two copper sources within fifth zone 132 may be configured to emit copper plumes from multiple effusion ports spanning the width of the substrate web. Furthermore, the copper sources may be disposed on the entrant side of the fifth zone 132 to allow relatively more time between copper deposition and subsequent layer deposition. Fifth zone 132 may also include a selenium source.

Sixth zone 134 may be configured to deposit a second layer of gallium-indium onto the web. In construction, sixth zone 134 may be similar to second zone 112. The thickness of the gallium-indium layer deposited in sixth zone 134 may be small relative to the thickness of the GI layer deposited in second zone 112. In sixth zone 134, gallium and indium may be emitted at somewhat lesser effusion temperatures relative to the effusion temperatures of the gallium and indium emitted in second zone 112. These relatively lower temperatures result in lower effusion rates, and thus to a relatively thinner layer of deposited material. Such relatively low effusion rates may allow fine control over ratios such as the copper to gallium+indium ratio (Cu:Ga+In) and the gallium to gallium+indium ratio (Ga:Ga+In) near the p-n junction, each of which can effect the electronic properties of the resulting PV cell. As in the second zone 112, gallium may be emitted slightly earlier along the web path than indium, to promote better adhesion to the underlying layers of molecules.

Seventh zone 136 may be similar in construction to one or both of second zone 112 and sixth zone 134 and may be configured to deposit a third slow-growth, high quality layer of gallium-indium (GI) onto the substrate web. In some embodiments, this final deposition zone and/or GI layer may be omitted from the deposition process, or a layer of indium alone may be deposited in seventh zone 136. As in sixth zone 134, application of a relatively thin, carefully controlled layer of gallium and/or indium allows control over ratios such as (Cu:Ga+In) and (Ga:Ga+In) near the p-n junction. This may have a beneficial impact on the efficiency of the cell by, for example, allowing fine-tuning of the electronic band gap throughout the thickness of the CIGS layer. Furthermore, the final layer of GI is the last layer applied to complete formation of the p-type CIGS semiconductor, and it has been found beneficial to form a thin layer of GI having a relatively low defect density adjacent to the p-n junction that will be subsequently formed upon further application of an n-type semiconductor layer on top of the CIGS layer.

As shown in FIG. 4, second zone 112 may include two gallium sources 114 disposed substantially symmetrically across the transverse dimension of the web, and two indium sources 116 disposed substantially symmetrically across the transverse dimension of the web. In other words, two sources containing identical deposition material may span the width of substrate web 102, to provide a layer of material across the entire width of the web having a uniform thickness. The operation, including effusion rate and/or temperature of each source in a zone may be controlled and/or monitored independently of the second source in the zone having the same deposition material. For example, each gallium source 114*a* may include a heating element that is adjustable independent of a heating element included in the second gallium source 114*b*.

This basic structure, with at least two independently operable heated sources containing the same deposition material spanning the web width, may be common to each of the zones of chamber 100 in which material is deposited onto the web (deposition zones 110, 112, 126, 132, 134 and 136). By providing two independent sources of material disposed substantially symmetrically across the width of the web, the thickness of each deposited material may be independently monitored on each side of the web, and the temperature of each source may be independently adjusted in response. This allows a wider web to be used, leading to a corresponding gain in processing speed per unit area, without compromising material thickness uniformity.

Figure 5:
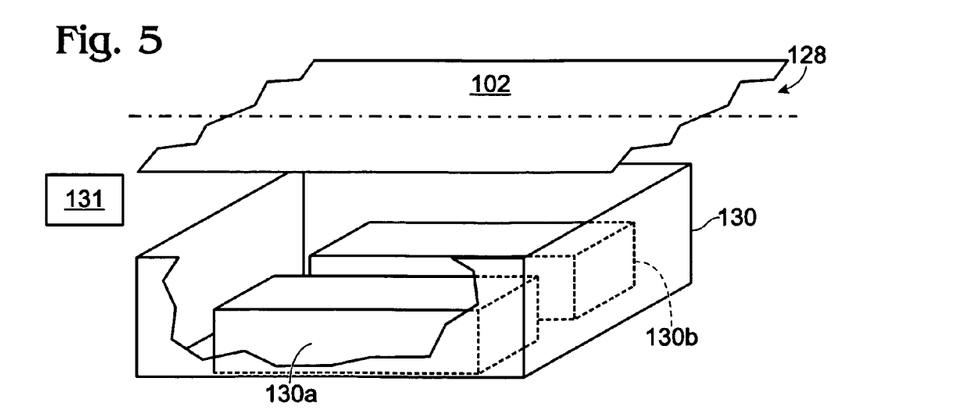
FIG. 5 is a schematic perspective view of a monitoring station for detecting one or more properties of a layer(s) deposited on a moving web.
Figure 6:
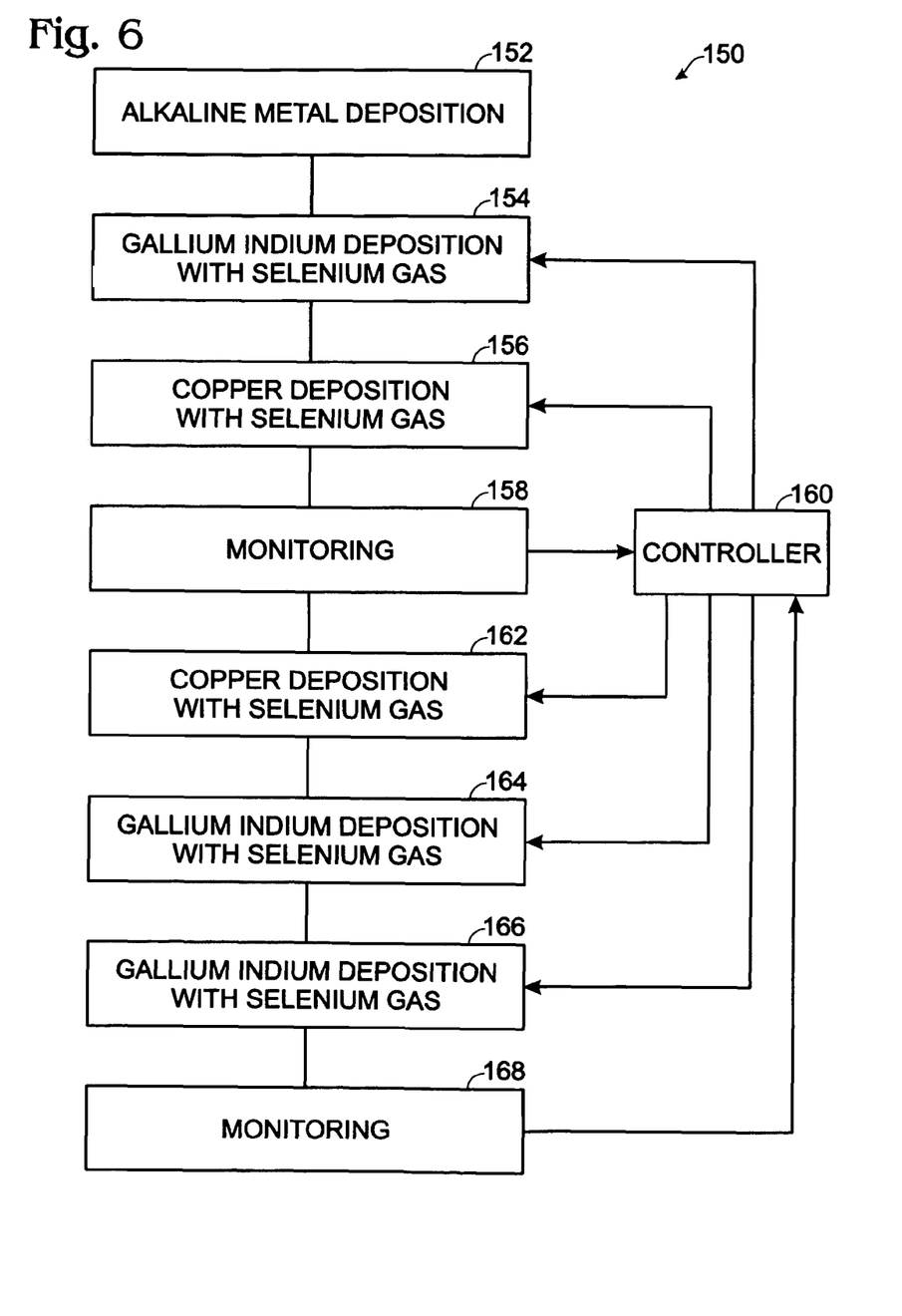
FIG. 6 is a flow chart illustrating a method for producing thin-film semiconductor layers.

Turning now to FIG. 5, sensing zone 128 may include sensors configured to monitor the layers of material deposited in one or more of the zones 110, 112 and 126. Exemplary types of sensors may include one or more of X-Ray Florescence, Atomic Absorption Spectroscopy (AAS), Parallel Diffraction Spectroscopic Ellipsometry (PDSE), IR reflectometry, Electron Impact Emission Spectroscopy (EIES), in-situ x-ray diffraction (XRD) both glancing angle and conventional, in-situ time-resolved photoluminescence (TRPL), in-situ spectroscopic reflectometry, in-situ Kelvin Probe for surface potential, and in-situ monitoring of emissivity for process endpoint detection. Sensing zone 128 may further include a sensing shield such as an angled polyimide sensor shield. Sensing zone 128 may use an $H_2O$ cooled enclosure. As shown in FIG. 6, sensing zone 128 has a monitoring station 130 configured to collect data indicating properties, for example, relating to layer uniformity, of material deposited on web 102. In a preferred embodiment, monitoring station 130 contains multiple sensors 130a and 130b across the width of the web, corresponding to the set of two independently controllable sources of material that are disposed substantially symmetrically across the width of the substrate web in each deposition zone, provides the ability to monitor and control layer uniformity across the width of the web.

Specifically, monitoring station 130 in sensing zone 128 may include sensors 130a and 130b. One or more computers, 131, may be configured to analyze data from the monitoring station to monitor a property, such as thickness, of one or more of the deposited layers, and subsequently adjust the effusion rates and/or temperatures of a corresponding source in deposition zones 110, 112, and/or 126. Additionally and/or alternatively, the effusion rates and/or temperatures of a corresponding source in downstream deposition zones 132, 134, and/or 136 may be adjusted in view of a property monitored by a sensor in sensing zone 128.

Additionally and/or alternatively, a second similar monitoring station just prior to take-up roller 106 may be used. Similar to monitoring station 130 in zone 128, monitoring station 140 may include two sensors provided across the width of the web, corresponding to the two independently controllable sources of each material that are disposed substantially symmetrically across the width of the web in each deposition zone. Monitoring station 140 monitors one or more properties of the layers of material deposited in one or more of zones 132, 134 and 136 and/or zones 110, 112 and 126. Monitoring station 130 may monitor a property of the gallium-indium and copper material layers deposited in zones 112 and 126, while monitoring station 140 cooperatively monitors one or more properties of the copper and gallium-indium material layers deposited in zones 132 and 134.

The flow chart in FIG. 6 depicts an exemplary method of depositing a thin film semiconductor layer on a substrate including feedback systems in accordance with the present disclosure. As described earlier, properties, such as thickness, of deposited layers are at least partially dependant on effusion rates of the sources containing the deposition material. The effusion rate of a source may be altered by changing the temperature of the source. A system including one or more feedback systems may be configured to adjust the effusion rate of a source in response to a monitored property of a deposited layer of material, for example by adjusting the temperature of the source. The method shown in FIG. 6 may be used to produce a more consistently uniform deposition of material layers.

FIG. 6 shows a preferred method and procedure 150 for depositing thin-film semiconductor materials. A web material is fed through a series of deposition zones and sensing zones as previously described and illustrated. A first step 152 in the process involves depositing an alkaline metal, for example, in the form of sodium chloride on the web. In a second step 154, a layer of gallium and indium is deposited in the presence of selenium gas. In a third step 156, a copper layer is deposited on top of the gallium indium layer, in the presence of selenium gas. A next step monitoring 158 monitors and controls the quality of the layers being created in the first two steps.

Data generated in monitoring step 158 may be used and/or processed by controller 160 to provide feedback control and/or correction/adjustment of steps 154 and 156 as the process continues.

After monitoring step 158, step 162 carries out deposition of a second copper layer in the presence of selenium gas. Step 162 is followed by a series of two steps 164 and 166 of gallium and indium, in the presence of selenium gas. As shown in FIG. 6, a final monitoring step 168 is carried out to provide further monitoring and control capability, via controller 160, particularly with respect to the layers being created in steps 162, 164 and 166.

Figure 7:
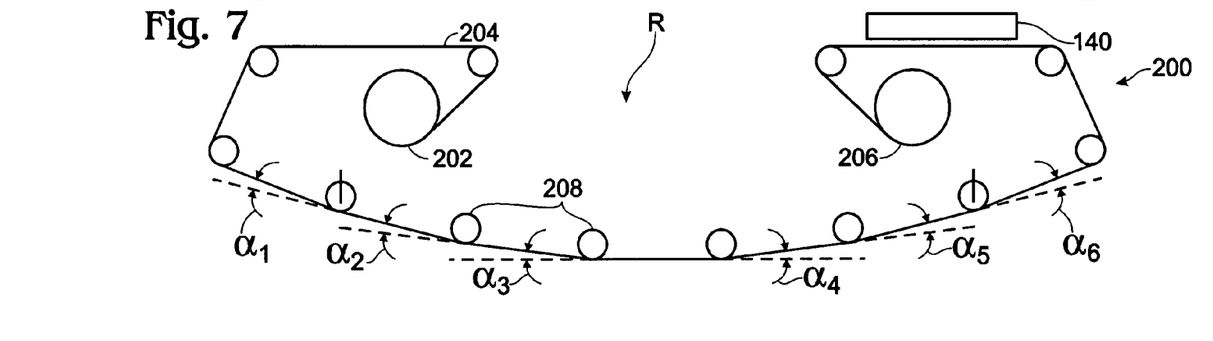
FIG. 7 is a schematic side view of a web transport device.

FIG. 7 shows a system for depositing a thin film semiconductor layer including a transport-guide structure defining a processing path for a flexible substrate. Transport-guide structure 200 may be configured to maintain a desired tension on substrate web 204. The desired tension may depend on the width of the substrate web, for example a 30 cm wide substrate web may have a desired tension of approximately 30-35 lbs. Maintaining tension on the web may reduces curling of the web and/or helps to maintain a substantially flat surface for deposition of evaporated materials in the deposition zones.

A transport-guide processing path may wind around a number of rollers in a generally curved, non-planar overall configuration. The substrate web may at least partially wrap around transport rollers in zone transition areas to maintain substrate web flatness and proper web guiding between each zone. The wrap angle may create marginally enough friction to make the free roller rotate at the same speed as the substrate web travel speed. The transport rollers may be non-driven and may rotate freely at the same speed as substrate web travel. If the rollers do not move at the same speed as the traveling substrate web, the substrate web may slide across 1 or more rollers, scratching the back surface of the web. These scratches 'print-thru' to the front side, causing defects in the CIGS coating that reduce solar cell efficiency.

In accordance with the present disclosure, transport-guide structure 200 includes pay-out roll 202 configured to supply flexible substrate web 204 into deposition region R and take-up roll 206 is configured to receive substrate web 204 at the end of the process. Pay-out roll 202 and take-up roll 206 may be driven by independent motors. Transport rollers 208 may be located at spaced intervals along the processing path of substrate web 204. The spaced intervals are generally uniform in length and/or may include one or more deposition or sensing zones.

Placement of transport rollers within deposition chamber 200 may be such that a pair of adjacent transport rollers may be configured to orient the substrate web within a spaced interval or zone at a particular angle relative to the horizontal. The angle of the substrate material relative to the horizontal may vary between each zone as a function of placement of the transport rollers. In the embodiment shown, similar to FIG. 3, deposition chamber 200 includes seven zones. The angle of the substrate material relative to the horizontal may progressively vary by a degrees between each zone. The progressive change a may be the same, for example $\alpha1$-$\alpha6$ may equal approximately 7 degrees per roller (per turn). Alternatively, the degree of change between each zone $\alpha1$-$\alpha6$ may vary. The angle of the substrate material relative to the horizontal may not be so great, however, that evaporated material can not be deposited uniformly on the substrate.

Transport roller material may include stainless steel such as Type 304 stainless. The shape of the transport rollers themselves may be configured to ensure a central flat surface area on the substrate to deposit evaporated materials. Slightly tapered rollers can maintain web tension and a central flat surface area by distributing tension on the web in a way that 'pulls' the web toward the roller edges from the centerline and helps keep the web flat. For example, the taper may be created by about a 0.003" curvature at the edges of a 3" diameter roller.

IV. Sources

This section describes methods and apparatus for controlling the temperature of the effusion ports that emit vapor plumes to be deposited on the substrate web during the p-type semiconductor deposition process.

As described previously and depicted schematically in FIG. 2, a semiconductor layer generally may be deposited onto a substrate web sequentially, by applying various components of the layer separately and/or in overlapping combinations. Whereas FIG. 2 depicts the deposition occurring within a single deposition chamber 24, alternatively, deposition may occur within a series of separated (i.e. discrete) deposition zones, with one or more materials deposited within each zone. FIG. 4 is a perspective view showing an exemplary discrete deposition zone 112 for depositing one or more semiconductor materials onto a substrate web 102. FIG. 4 shows zone 112 with its surrounding enclosure in dashed lines.

Zone 112 of FIG. 4 is configured to deposit a layer of gallium-indium (GI) selenide onto substrate web 102 (including any previously deposited layers of material). GI is deposited through the nearly simultaneous—but separate—deposition of gallium and indium onto the same portion of the moving web. As indicated in FIG. 4, however, gallium sources 114 are located slightly before indium sources 116 within the deposition zone, so that a small amount of gallium is deposited onto the web prior to deposition of any indium. Selenium source 118 may be located before the gallium sources 114 and may be configured to provide selenium gas to second zone 112, up to a pressure in the range of approximately 700-2000 µTorr. Providing a background of selenium gas results in deposition of selenide along with the GI layer. Because gallium or gallium selenide adheres better to the underlying web, this arrangement results in better overall adhesion of the GI layer deposited in the second zone.

Each gallium and indium source within a zone includes a crucible or body portion, and a lid containing one or more effusion ports. A deposition material is liquefied or otherwise disposed within the body portion of a given source, and emitted at a controlled temperature in plumes through effusion ports. Each zone may itself be enclosed within a separate solid enclosure. Generally, each enclosure will surround the associated deposition zone substantially completely, except for an aperture in the top portion of the enclosure over which the moving substrate web passes. This allows separation of the deposition zones from each other, providing the best possible control over parameters such as temperature and selenium pressure within each zone. A deposition material is liquefied or otherwise disposed within the body portion of a given source, and emitted at a controlled temperature in plumes through the effusion ports. As described previously, because the angular flux of material emitted from a port with a particular geometry is a function primarily of temperature, this allows for control over the thickness and uniformity of the deposited layers created by the vapor plumes.

FIGS. 8-13 depict closer views of portions of a heated effusion source 300, examples of which include any one of effusion sources 114 or 116, for generating a vapor plume of material to be deposited onto a substrate web. Although these sources have been described previously as suitable for generating plumes of gallium or indium, the plume may be composed more generally, for example, of sodium fluoride, gallium, indium, copper, or a combination of two or more of these materials.

Figure 8:
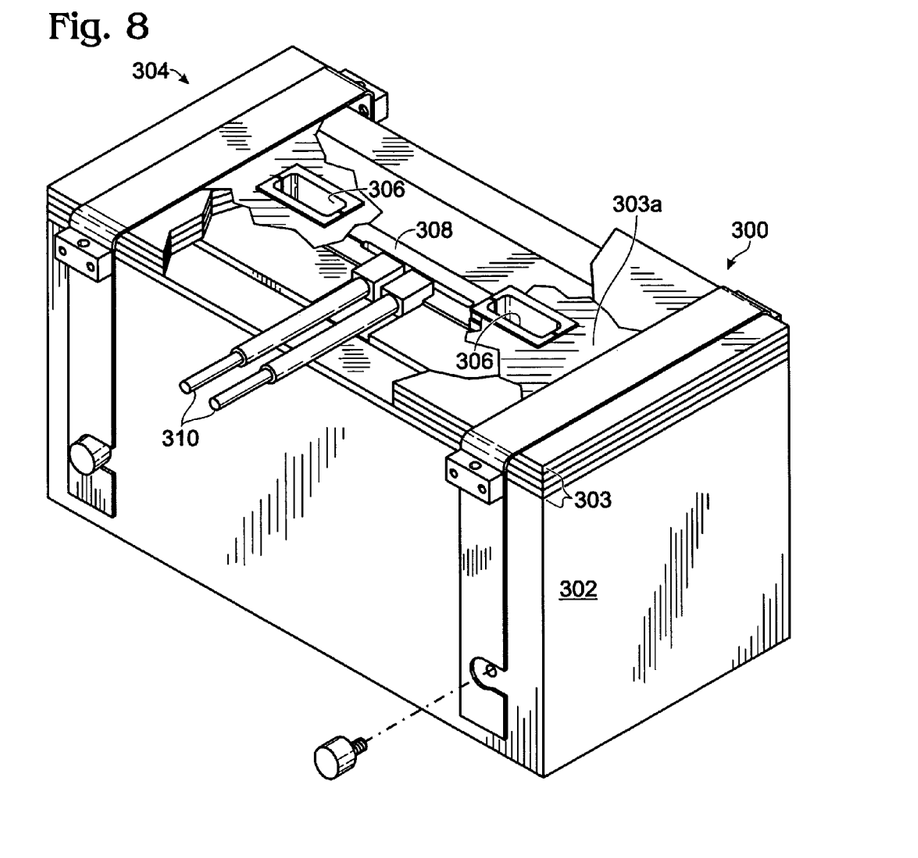
FIG. 8 is a perspective cut away view of a source used to deposit material onto a moving web.

As in the case of sources 114 and 116, source 300 has a body portion 302, and a lid 304 with integral effusion ports 306. Each effusion port 306 may be formed by two complimentary looped portions of a heating element 308 integral with lid 304. In such a configuration, lid 304 may also be referred to as a "heater plate." Heating element 308 may radiated directly toward the source material in body portion 302 or heating element 308 may radiate heat to lid 304, which the re-radiates to the source material. Heating element 308 may be fully contained within lid 304 or alternatively a portion or all of heating element 308 may be exposed and/or extend towards the source material and/or deposition region R.

Figure 10:
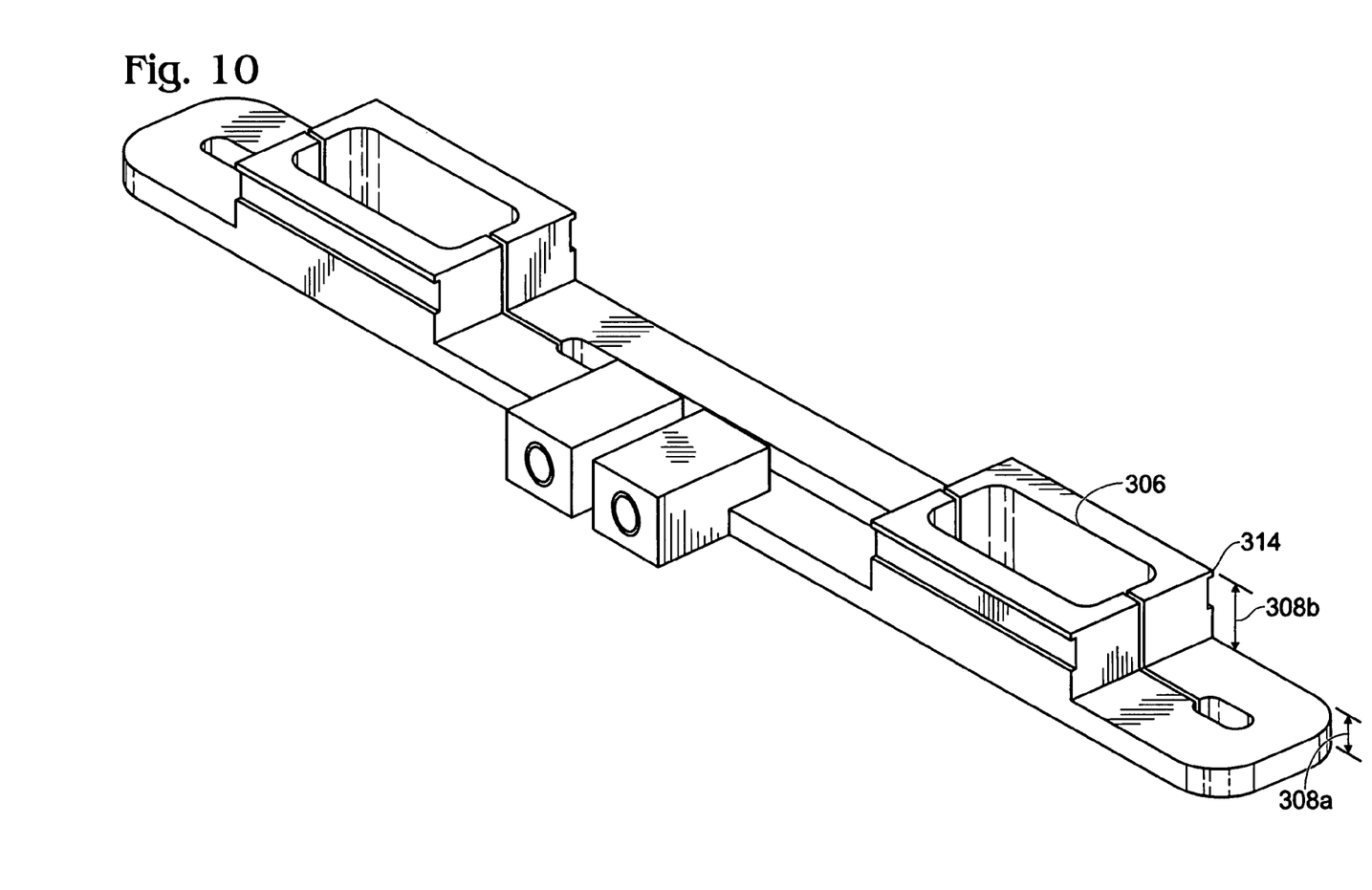
FIG. 10 is a perspective view of the heating device shown in FIG. 9.

As best seen in FIG. 10, heating element 308 may have a base height 308a and a nozzle or port height 308b extending above the base height 308a. The base height 308a and the port height 308b may together form the walls of the effusion ports 306. The port height 308b may extend about 6 mm (2-25 mm) above base height 308a. The surface area of the bottom face of heating element 308 may be approximately 23.87 cm$^2$. Lid 304 may be 112.69 cm$^2$ in area (on the upper face) and 112.69 cm$^2$ area normal to the horizontal plane for the lower face.

Lid 304 materials may include, for example, graphite, such as ET10 graphite manufactured by the Ibiden Corporation of Elgin, Ill. This underlying graphite may be coated with a material, such as pyrrolitic boron nitride, designed to withstand the extreme conditions associated with heated effusion. The lid material is electrically conducting, so that lid 304 can function as a self-contained heater as well as a lid with integrated effusion ports. Insulation included in lid 304 may surround at least the outside of effusion ports 126 above the base height of heating element 308 in the form of insulation layers 303, which may include graphite or carbon felt.

Insulation layers 303 may also include a top layer 303a of thin graphite foil. Effusion ports 306 may be configured to retain the top most portion of the lid and/or insulation below the top most portion of the effusion port. If any portion of insulation or lid should extend above the effusion port opening, then effusing metal accumulates and condenses rapidly around the protrusion. To avoid condensation of effusing material, the final solid element that may be exposed to the effusing metal vapor stream must be the heated effusion port. Specifically, the outside of at least one wall of effusion ports 306 may include a lip 314 configured to retain thin graphite foil layer 303a just below the top level of effusion port 306. Thin foil layer 303a in turn keeps the necessary insulation (such as graphite felt) around the heated ports below the top level of the port.

Figure 9:
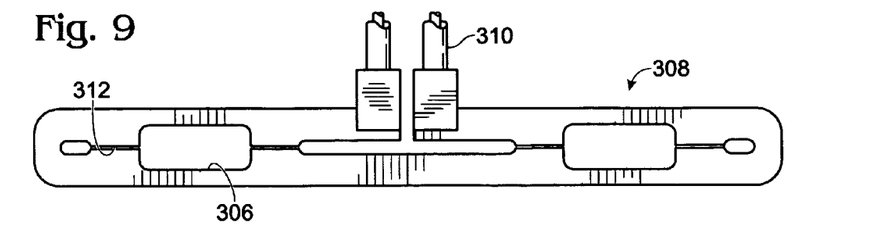
FIG. 9 is an isolated top view of a heating device used in the source illustrated in FIG. 8.

To supply power to the lid/heater, a pair of electrical contacts 210 may extend in toward the central portion of the lid. These contacts generally are configured to apply a voltage across the lid, creating an electrical current that heats the lid resistively. Thus, by controlling the applied voltage and/or current, the lid, including the effusion ports, may be heated to any desired temperature. By applying electrical contacts to the symmetric center of the lid (rather than to one side), resistive loss effects also should be symmetric, resulting in substantially equal temperatures for both effusion ports.

Each effusion port 306 may be formed by two complimentary looped portions of heating element 308. Each port may be spaced equidistantly from a pair of electrical contacts 210 to obtain substantially equal temperatures for both ports. The curve of the looped portion may be configured to avoid brittleness or cracking of the heating element, for example the curve may be gradual or C-shaped. The looped portions of the heating element may be electrically insulated from each other by an electrically insulated gap 212 including a dielectric material. The height and shape of effusion ports 306 formed by heating element 308 may be configured to uniformly deposit evaporated material on a moving substrate.

The structure illustrated in FIGS. 8-13 may have a number of desirable features. By incorporating a heater within the lid, direct control is obtained over the temperature of effusion ports 306. In comparison to systems in which a separate heater (for example, surrounding or otherwise in close proximity to the effusion ports) is used, the present configuration therefore may result in faster response times and more accurate temperature control. In addition, the illustrated structure includes effusion ports 306 that are carefully designed to produce material plumes that coat an overlying substrate web evenly from side to side. This is accomplished both by a careful choice of effusion port dimensions, and also by spacing the ports at appropriately chosen distances from the source edges and from each other. The choice of exactly two effusion ports, rather than three or more, also may result in substantially equal temperatures of the ports due to equal edge effects within each source. Furthermore, the integral port/heater combination maintains high temperatures at the port surfaces exposed to the effusing flux, thus preventing evaporate condensation and subsequent "spitting," which negatively effects system quality.

Figure 11:
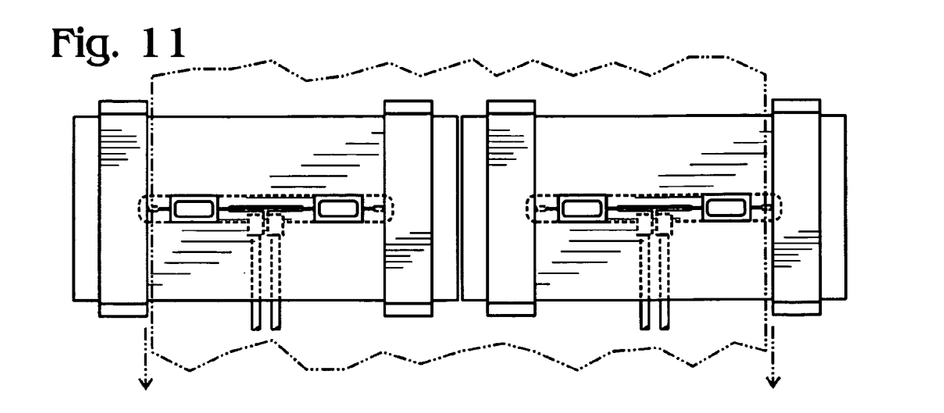
FIGS. 11-13 are schematic top views of various source and heater configurations for depositing thin-film semiconductor materials onto a moving web.
Figure 12:
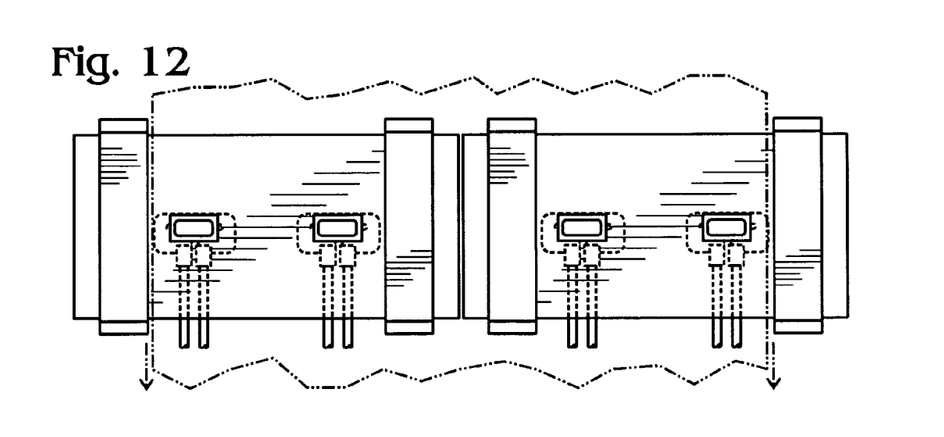
Figure 13:
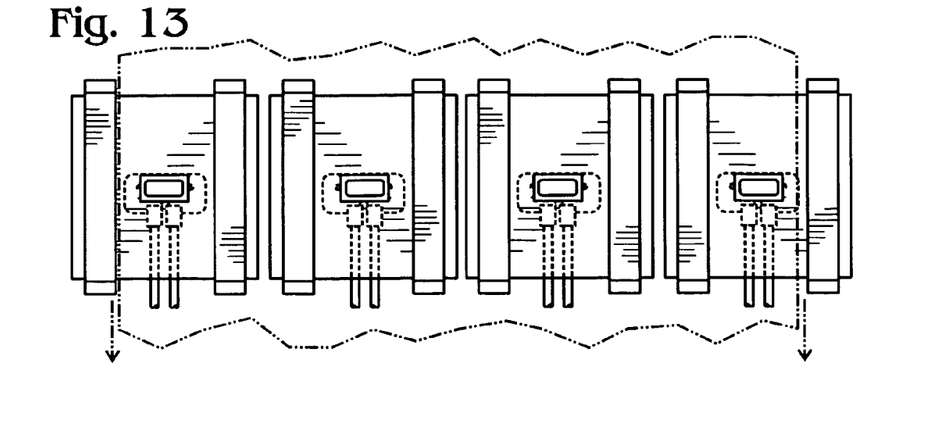

FIGS. 11-13 illustrate different embodiments of a system including at least two heated sources disposed substantially symmetrically across the width of the substrate web. As shown in FIGS. 11-13, the edges of the substrate web may extend to approximately outer edges of the outer most effusion ports. In other embodiments, the edges of the substrate web may extend beyond the outer edges of the outermost effusion ports. In such embodiments the edges of the substrate web may be cut off during subsequent processing.

Also illustrated in FIGS. 11-13 is an exemplary distribution of an array of effusion ports across the width of a processing path, indicated by directional arrows. A uniform distribution of the effusion port array may result in a greater concentration of material in the center most region of the processing path than in the outside or lateral regions. Accordingly, the distribution of the effusion port array across the width of the processing path may be configured to obtain uniform coating thickness on a substrate web for a source-web distance. In some instances, the spacing between the center-most effusion ports of the array in the center of the processing path should be greater than the spacing between effusion ports on the outside of the array in the lateral regions of the processing path. This configuration produces a more uniformly coated substrate web. Nozzle spacing distances may be calculated for optimal layer uniformity by using vapor density relationships from a single nozzle orifice, and then assuming superposition of multiple plumes from multiple ports to yield total expected metal thickness over a given deposition area.

This application also incorporates by reference in their entireties the following patents: Reissue U.S. Pat. No. Re 31,968, U.S. Pat. Nos. 5,441,897, 5,356,839, 5,436,204, and 5,031,229.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following claims particularly point out certain combinations and subcombinations regarded as novel and nonobvious. Inventions embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original numbered paragraphs that follow, also are regarded as included within the subject matter of the inventions of the present disclosure. For various thin layer deposition applications, different combinations of deposition steps and zones may be used in addition to the specific deposition zone configurations described above and in the following claims. None of the particular steps included in the examples described and illustrated are essential for every application. The order of steps/zones, combination of steps/zones, and the number of steps/zones may be varied for different purposes. It may sometimes be useful to increase the number of deposition zones while decreasing the amount of material deposited at each zone. It may also be useful to increase the number of sources used to deposit material over the width of a web, with or without multiple corresponding monitoring devices to carry out on-the-fly adjustment of heater temperatures and resulting improvements in thin layer uniformity across the web. Other variables may be controlled via the described monitoring stations, for example speed of web transport, pressure, selenium gas output, web temperature, etc.

We claim:

1. A method of depositing a thin film semiconductor layer onto a flexible substrate, comprising:
   transporting a substrate web through a multi-zone deposition region,
   depositing onto the web, within a first substantially enclosed gallium indium deposition zone, a first layer of gallium indium in the presence of selenium gas,
   depositing onto the web, after depositing the first layer of gallium indium and within a first substantially enclosed copper deposition zone, a first layer of copper in the presence of selenium gas,
   depositing onto the web, after depositing the first layer of copper and within a second substantially enclosed gallium indium deposition zone, a second layer of gallium indium in the presence of selenium gas,
   monitoring by x-ray fluorescence a characteristic of one or more layers deposited on the web, and
   adjusting a deposition rate in one of the zones based on data generated from the monitoring step, wherein the monitoring step is performed before depositing the second layer of gallium indium.

2. The method of claim 1, wherein the depositing steps are carried out by effusing material from heated sources, the adjusting step including changing a heater temperature in one of the zones.

3. The method of claim 2, wherein the changing step is carried out while the web translates through the multi-zone deposition region.

4. The method of claim 2, wherein the changing step is carried out in the first substantially enclosed gallium indium deposition zone.

5. The method of claim 2, wherein the changing step is carried out in the second substantially enclosed gallium indium deposition zone.

6. The method of claim 2, wherein the changing step is carried out in the first enclosed copper deposition zone.

7. The method of claim 1, wherein the amount of gallium indium deposited in the second substantially enclosed gallium indium deposition zone is less than about 50% of the amount of gallium indium deposited in the first substantially enclosed gallium indium deposition zone.

8. The method of claim 1, wherein the amount of gallium indium deposited in the second substantially enclosed gallium indium deposition zone is less than about 10% of the amount of gallium indium deposited in the first substantially enclosed gallium indium deposition zone.

9. The method of claim 1, further comprising
monitoring by x-ray fluorescence a characteristic of one or more layers deposited on the web after the last step of depositing gallium indium.

10. The method of claim 1, further comprising
depositing onto the web, after depositing the second layer of copper and within a third substantially enclosed gallium indium deposition zone, a second layer of gallium indium in the presence of selenium gas.

11. The method of claim 10, wherein the combined amount of gallium indium deposited in the second and third substantially enclosed gallium indium deposition zones is less than about 50% of the amount of gallium indium deposited in the first substantially enclosed gallium indium deposition zone.

12. The method of claim 10, wherein the combined amount of gallium indium deposited in the second and third substantially enclosed gallium indium deposition zones is less than about 10% of the amount of gallium indium deposited in the first substantially enclosed gallium indium deposition zone.

13. The method of claim 1, wherein the multi-zone deposition region has multiple adjacent processing zones running parallel to the direction of web travel, the monitoring step including detecting nonuniformity of deposited layers between adjacent processing zones, and initiating appropriate heating changes to produce more uniform layer thickness between adjacent processing zones.

14. A method of depositing a thin film semiconductor layer onto a flexible substrate, comprising:
transporting a substrate web through a multi-zone deposition region,
depositing onto the web, within a first substantially enclosed gallium indium deposition zone, a first layer of gallium indium in the presence of selenium gas,
depositing onto the web, after depositing the first layer of gallium indium and within a first substantially enclosed copper deposition zone, a first layer of copper in the presence of selenium gas,
depositing onto the web, after depositing the first layer of copper and within a second substantially enclosed copper deposition zone, a second layer of copper in the presence of selenium gas,
depositing onto the web, after depositing the second layer of copper and within a second substantially enclosed gallium indium deposition zone, a second layer of gallium indium in the presence of selenium gas,
monitoring by x-ray fluorescence, between the steps of deposition the first and second layers of copper, a characteristic of one or more layers deposited on the web, and
adjusting a deposition rate in one of the zones based on data generated from the monitoring step, wherein the monitoring step is performed before depositing the second layer of gallium indium.

15. A method of depositing a thin film semiconductor layer onto a flexible substrate, comprising:
transporting a substrate web through a multi-zone deposition region,
depositing onto the web, within a first substantially enclosed gallium indium deposition zone, a first layer of gallium indium in the presence of selenium gas,
depositing onto the web, after depositing the first layer of gallium indium and within a first substantially enclosed copper deposition zone, a first layer of copper in the presence of selenium gas,
depositing onto the web, after depositing the first layer of copper and within a second substantially enclosed copper deposition zone, a second layer of copper in the presence of selenium gas,
depositing onto the web, after depositing the second layer of copper and within a second substantially enclosed gallium indium deposition zone, a second layer of gallium indium in the presence of selenium gas, and
monitoring a characteristic of one or more layers deposited on the web at multiple monitoring stations along the process.

16. The method of claim 15, wherein the monitoring step includes using x-ray fluorescence.

17. The method of claim 15, wherein the monitoring step is carried out between the steps of depositing the first and second layers of copper, and after depositing the second layer of gallium indium.

* * * * *